United States Patent
Uemura et al.

(10) Patent No.: US 9,120,060 B2
(45) Date of Patent: *Sep. 1, 2015

(54) VENTILATION UNIT

(75) Inventors: Kou Uemura, Osaka (JP); Youzou Yano, Osaka (JP); Atsushi Daimon, Osaka (JP)

(73) Assignee: Nitto Denko Corporation, Osaka (JP)

( * ) Notice: Subject to any disclaimer, the term of this patent is extended or adjusted under 35 U.S.C. 154(b) by 63 days.

This patent is subject to a terminal disclaimer.

(21) Appl. No.: 14/113,525

(22) PCT Filed: Jan. 10, 2012

(86) PCT No.: PCT/JP2012/000081
§ 371 (c)(1),
(2), (4) Date: Oct. 23, 2013

(87) PCT Pub. No.: WO2012/147241
PCT Pub. Date: Nov. 1, 2012

(65) Prior Publication Data
US 2014/0047981 A1    Feb. 20, 2014

(30) Foreign Application Priority Data
Apr. 27, 2011 (JP) ................. 2011-099880

(51) Int. Cl.
| | |
|---|---|
| *B01D 53/22* | (2006.01) |
| *B01D 53/04* | (2006.01) |
| *B01D 46/00* | (2006.01) |
| *B01D 53/02* | (2006.01) |
| *B01D 46/10* | (2006.01) |
| *B01D 29/05* | (2006.01) |

(Continued)

(52) U.S. Cl.
CPC .............. *B01D 69/10* (2013.01); *H05K 5/0213* (2013.01)

(58) Field of Classification Search
CPC ........ B01D 53/22; B01D 53/04; B01D 46/00; B01D 53/02; B01D 46/10; B01D 29/05
USPC ............ 55/385.4, 502; 96/4; 95/45; 454/367; 123/41.86
See application file for complete search history.

(56) References Cited

U.S. PATENT DOCUMENTS

| | | | |
|---|---|---|---|
| 5,891,223 A * | 4/1999 | Shaw et al. ...................... | 96/134 |
| 6,524,361 B1 * | 2/2003 | Thornton et al. ............ | 55/385.4 |
| 6,994,621 B2 | 2/2006 | Mashiko et al. | |

(Continued)

FOREIGN PATENT DOCUMENTS

| | | |
|---|---|---|
| JP | 1-161507 U | 11/1989 |
| JP | 4-043307 U | 4/1992 |

(Continued)

*Primary Examiner* — Duane Smith
*Assistant Examiner* — Minh-Chau Pham
(74) *Attorney, Agent, or Firm* — Hamre, Schumann, Mueller & Larson, P.C.

(57) ABSTRACT

A ventilation unit (1) includes: a ventilation member (2) configured to be attached to an opening (11) of a housing (10), the ventilation member (2) including a water-proof gas-permeable membrane (4) for covering the opening (11); a sealing member (6) configured to seal a gap between the housing (10) and the ventilation member (2); and a washer (7) configured to be pressed against the housing (10) by the ventilation member (2) around the sealing member (6). The washer (7) blocks a clearance formed outside the sealing member (6) and between a peripheral portion of the ventilation member (2) and the housing (10) when the ventilation member (2) is attached to the opening (11) of the housing (10).

8 Claims, 7 Drawing Sheets

(51) Int. Cl.
  *B01D 69/10* (2006.01)
  *H05K 5/02* (2006.01)

(56) References Cited

U.S. PATENT DOCUMENTS

| | | | |
|---|---|---|---|
| 7,678,169 B1 * | 3/2010 | Gwin et al. | 55/385.4 |
| 7,936,566 B2 | 5/2011 | Shigyo et al. | |
| 8,246,726 B2 * | 8/2012 | Yano | 96/4 |
| 8,814,993 B2 * | 8/2014 | Yano | 96/4 |
| 2002/0066370 A1 * | 6/2002 | Goglio et al. | 96/134 |
| 2006/0054019 A1 | 3/2006 | Waida | |
| 2008/0041624 A1 | 2/2008 | Sasaki et al. | |

FOREIGN PATENT DOCUMENTS

| | | |
|---|---|---|
| JP | 9-135085 | 5/1997 |
| JP | 2004-047425 | 2/2004 |
| JP | 2004-090875 | 3/2004 |
| JP | 2006-135250 | 5/2006 |
| JP | 2007-048585 | 2/2007 |
| JP | 2007-087666 | 4/2007 |
| JP | 2007-141959 | 6/2007 |
| JP | 2010-012842 | 1/2010 |
| JP | 2010-052701 | 3/2010 |
| JP | 2010-267538 | 11/2010 |
| WO | 2006/011496 | 2/2006 |

* cited by examiner

VENTILATION UNIT

TECHNICAL FIELD

The present invention relates to a ventilation unit including a ventilation member configured to be attached to an opening of a housing.

BACKGROUND ART

Conventionally, for example, in automobile electric components such as automobile lamps and ECUs (Electrical Control Units), OA (office automation) equipment, household electric appliances, and medical devices, a housing containing an electric component or a control board is provided with an opening for the purpose of reducing pressure variation in the housing caused by temperature change or allowing replacement of air in the housing, and a ventilation member is attached to the opening. The ventilation member ensures ventilation between the inside and outside of the housing and also prevents foreign matters such as dust and water from entering the housing.

For example, Patent Literature 1 discloses a ventilation member 100 as shown in FIGS. 6A and 6B. The ventilation member 100 includes: a water-proof gas-permeable membrane 120 for covering an opening 151 of a housing 150; a support 110 supporting the water-proof gas-permeable membrane 120 and configured to be fixed to the housing 150; and a cover component 130 covering the water-proof gas-permeable membrane 120.

The support 110 has a tubular shape as a whole, and includes: a flange portion 112 to which the water-proof gas-permeable membrane 120 is adhered; and an insertion portion 111 projecting from the flange portion 112 and configured to be inserted into the opening 151 of the housing 150. A sealing member 140 is mounted around the root portion of the insertion portion 111. The sealing member 140 is pressed against the housing 150 by the flange portion 112, so that a gap between the ventilation member 100 and the housing 150 is sealed.

The cover component 130 includes: a principal wall 131 facing the water-proof gas-permeable membrane 120; and a peripheral wall 132 extending from the peripheral portion of the principal wall 131 to the vicinity of a surface of the housing 150. In addition, the principal wall 131 is provided with through holes 133 for allowing a space facing the water-proof gas-permeable membrane 120 to communicate with the outside.

In addition, Patent Literature 2 discloses a ventilation structure 300 in which partition walls 152 are provided on the housing 150 so as to surround a ventilation member 200 as shown in FIGS. 7A and 7B. The partition walls 152 are arc-shaped walls spaced from each other, and have a height greater than that of the ventilation member 200.

CITATION LIST

Patent Literature

Patent Literature 1: JP 2007-87666 A
Patent Literature 2: JP 2004-47425 A

SUMMARY OF INVENTION

Technical Problem

For example, in the case of an electric component of an automobile, when the automobile is washed with high-pressure water, the electric component of the automobile may also be subjected to a jet of high-pressure water. In the case of using a ventilation member, a clearance is formed between the housing and a peripheral portion of the ventilation member that extends outwardly of a sealing member. Therefore, when the electric component of the automobile is subjected to a jet of high-pressure water as described above, a situation may arise where the high-pressure water acts on the sealing member through the clearance to deform the sealing member, and water consequently enters the housing.

However, when the cover component 130 has the peripheral wall 132 as in the ventilation member 100 disclosed in Patent Literature 1, the amount of high-pressure water acting on the sealing member 140 can be reduced. Nevertheless, in view of attachability and production error of the ventilation member 100, a clearance between the peripheral wall 132 and the housing 150 cannot be fully eliminated. Therefore, the possibility cannot be excluded that high-pressure water acts on the sealing member 140, and water consequently enters the housing.

Furthermore, in the case of the ventilation structure 300 disclosed in Patent Literature 2, a clearance between the partition walls 152 and the ventilation member 200 cannot be fully eliminated because a ventilation channel needs to be secured between the partition walls 152 and the ventilation member 200. Therefore, the ventilation structure 300 disclosed in Patent Literature 2 also has the same problem as the ventilation member 100 disclosed in Patent Literature 1.

In view of such circumstances, the present invention aims to provide a ventilation unit that can prevent foreign matters from entering a housing from between a ventilation member and the housing even in an environment where a high external pressure acts on the ventilation unit.

Solution to Problem

That is, the present invention provides a ventilation unit including: a ventilation member configured to be attached to an opening of a housing, the ventilation member including a water-proof gas-permeable membrane for covering the opening; a sealing member configured to seal a gap between the housing and the ventilation member; and a washer configured to be pressed against the housing by the ventilation member around the sealing member.

Advantageous Effects of Invention

With the above configuration, when the ventilation member is attached to the opening of the housing, a clearance formed outside the sealing member and between a peripheral portion of the ventilation member and the housing is blocked by the washer. Accordingly, it is possible to prevent foreign matters from entering the housing from between the ventilation member and the housing even in an environment where a high external pressure acts on the ventilation unit.

DESCRIPTION OF EMBODIMENTS

Hereinafter, embodiments of the present invention will be described with reference to the accompanying drawings. The following description relates to illustrative examples of the present invention, and the present invention is not limited by the examples.

Figure 1:
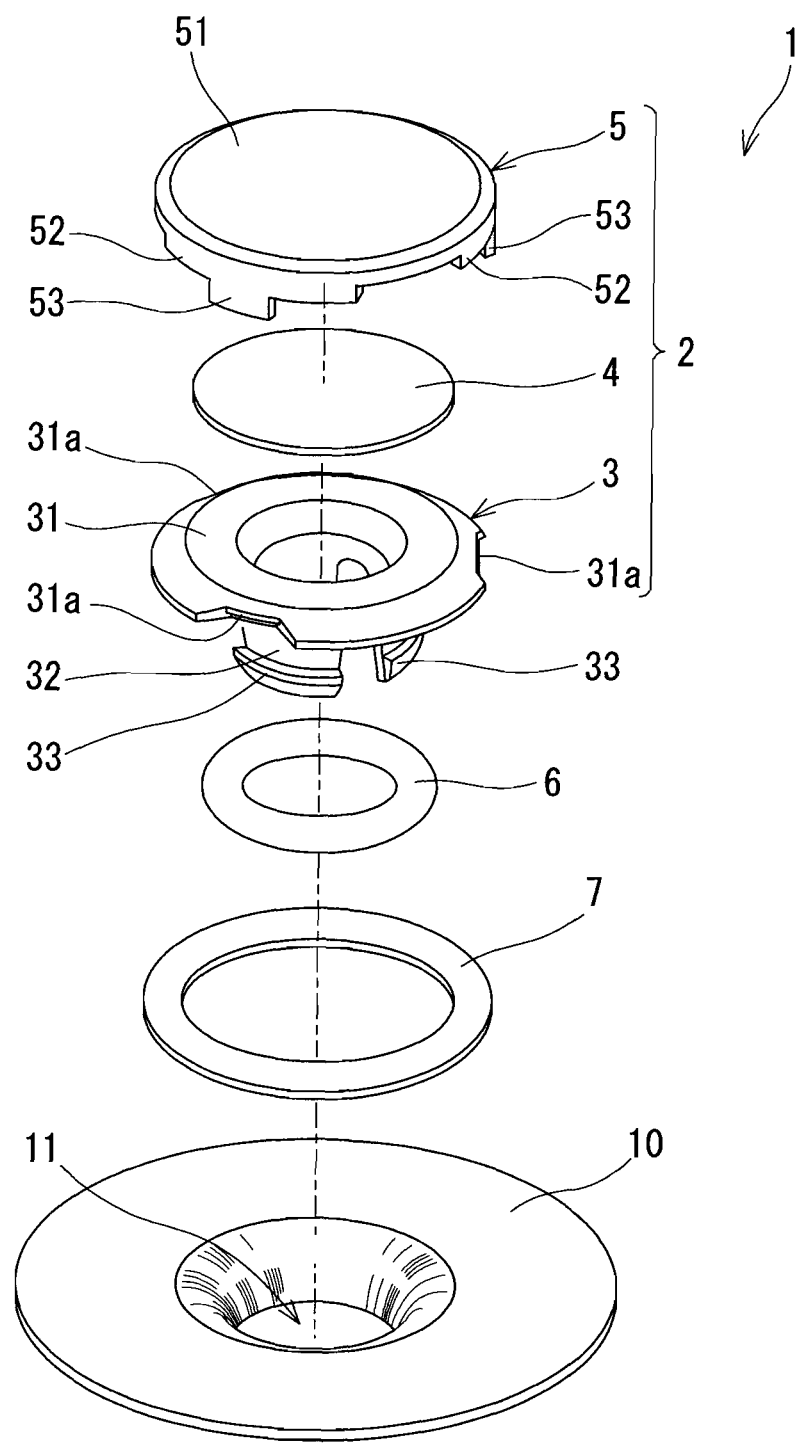
FIG. 1 is an exploded perspective view of a ventilation unit according to an embodiment of the present invention.
Figure 2:
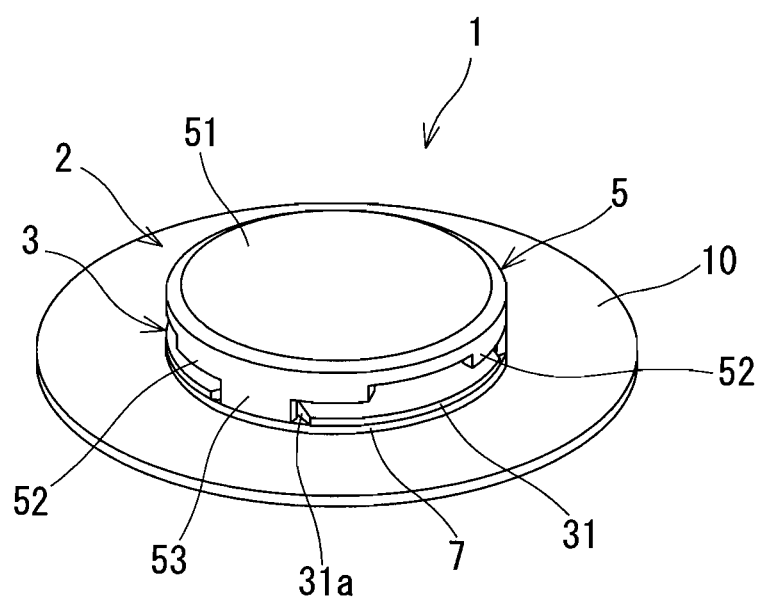
FIG. 2 is a perspective view of the ventilation unit of FIG. 1.
Figure 3:
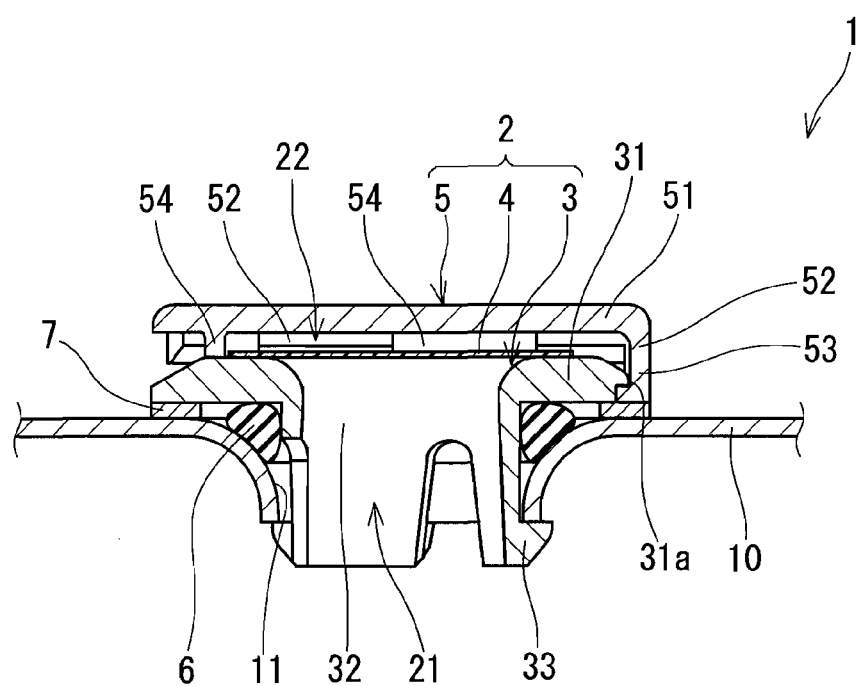
FIG. 3 is a cross-sectional view of the ventilation unit of FIG. 1.

A ventilation unit 1 according to an embodiment of the present invention is shown in FIGS. 1 to 3. The ventilation unit 1 includes: a ventilation member 2 configured to be attached to an opening 11 of a housing 10; a sealing member 6 configured to seal a gap between the housing 10 and the ventilation member 2; and a ring-shaped washer 7 surrounding the sealing member 6.

Figure 5:
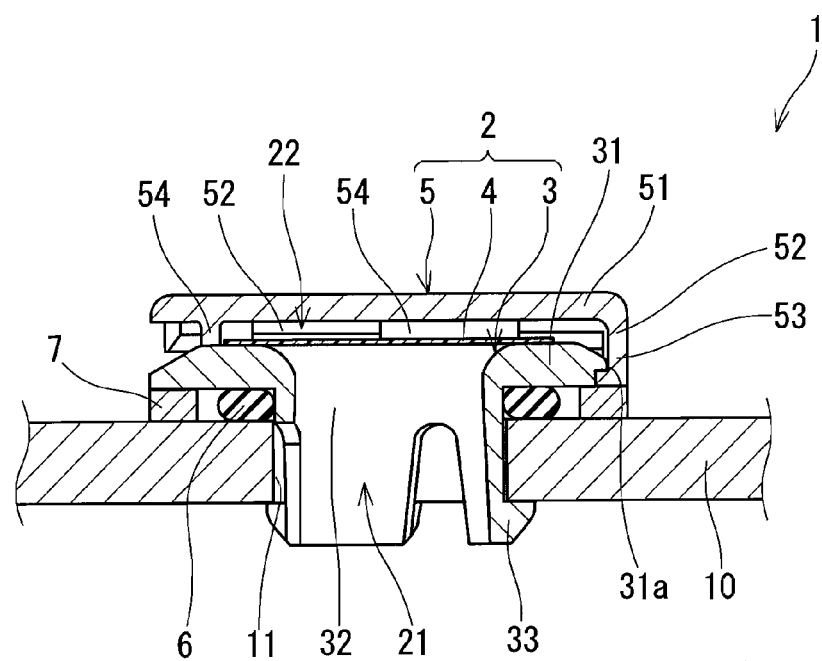
FIG. 5 is a cross-sectional view of a ventilation unit according to an example of modification.
Figure 6A:
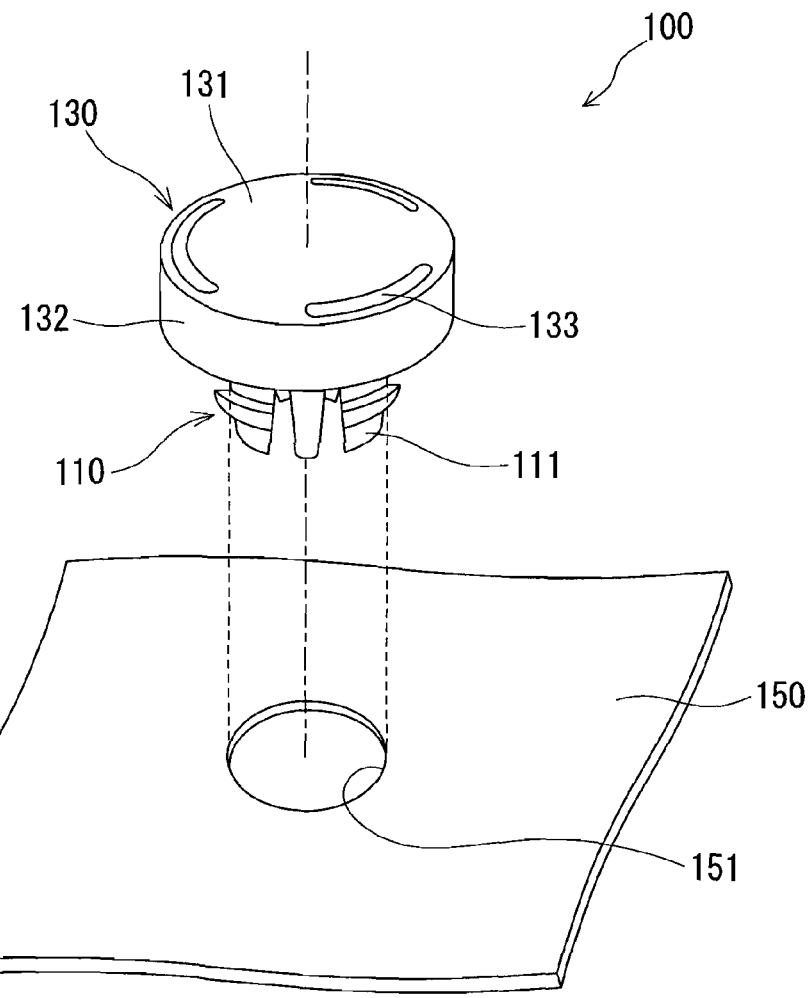
FIG. 6A is a perspective view of a conventional ventilation member.
Figure 6B:
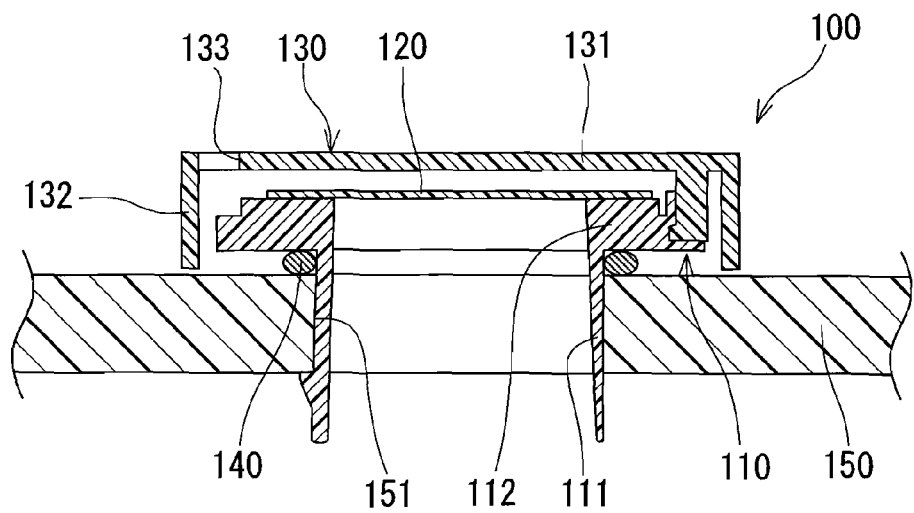
FIG. 6B is a cross-sectional view of the ventilation member.
Figure 7A:
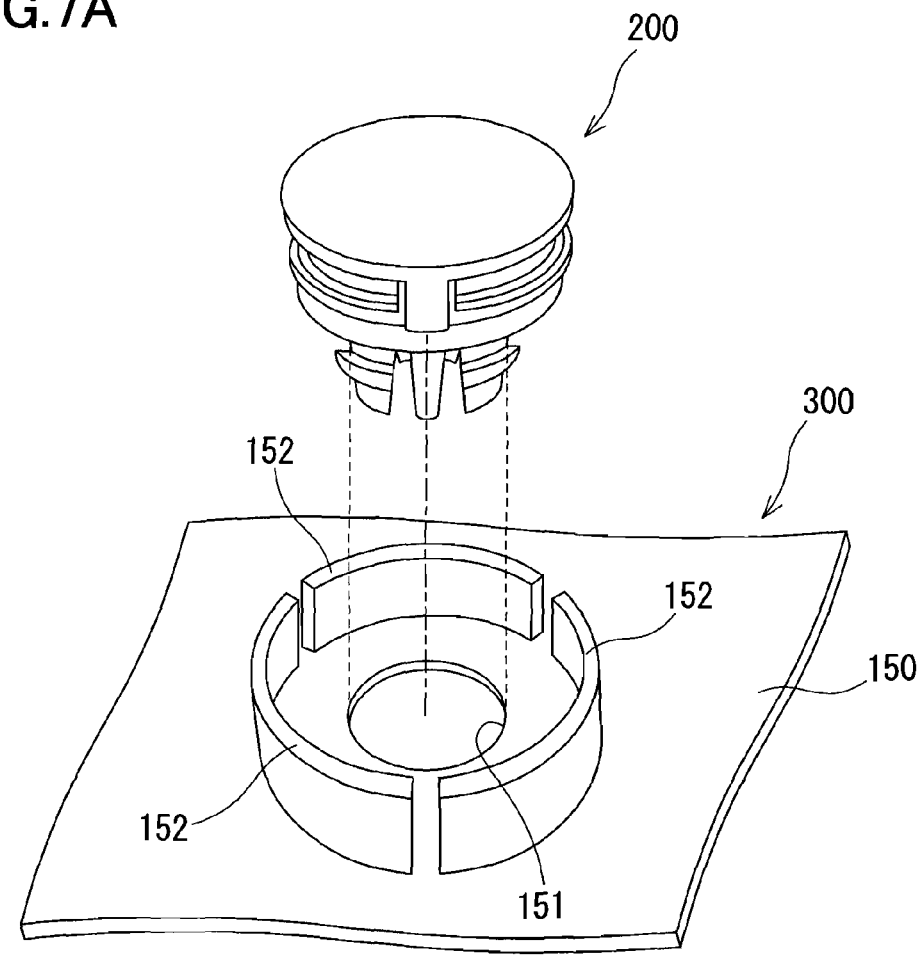
FIG. 7A is an exploded perspective view of a conventional ventilation structure.
Figure 7B:
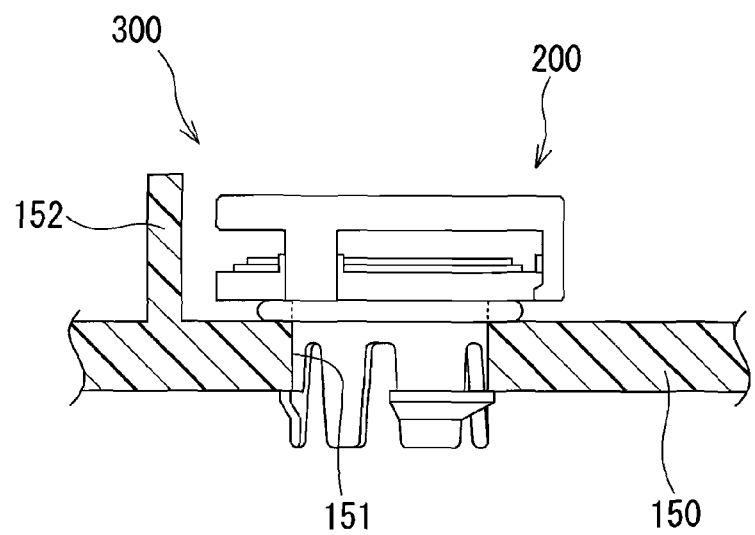
FIG. 7B is a cross-sectional view of the ventilation structure.

The direction in which the opening 11 opens is not particularly limited, and may be, for example, any of a vertically upward direction, a vertically downward direction, a horizontal direction, etc. Hereinafter, for convenience of explanation, the direction in which the opening 11 opens (a direction toward the upper side in FIG. 3) may be referred to as an upward direction, and the opposite direction (a direction toward the lower side in FIG. 3) may be referred to as a downward direction. In the present embodiment, the opening 11 is formed by burring of a thin plate that is a constituent material of the housing 10. That is, the opening 11 has a diameter decreasing from the outside of the housing 10 toward the inside of the housing 10. However, the opening 11 is not limited to such an opening. For example, as shown in FIG. 5, the opening 11 may be a straight hole formed in a thick plate that is a constituent material of the housing 10.

The ventilation member 2 includes: a water-proof gas-permeable membrane 4 for covering the opening 11 of the housing 10; a support 3 supporting the water-proof gas-permeable membrane 4 and configured to be fixed to the housing 10; and a cover component 5 covering the water-proof gas-permeable membrane 4.

The water-proof gas-permeable membrane 4 may be any membrane that allows permeation of gases and that blocks permeation of liquids (e.g., a woven fabric, a non-woven fabric, a mesh, or a net, which is made of resin or metal), and the structure and material of the water-proof gas-permeable membrane 4 are not particularly limited. For example, the water-proof gas-permeable membrane 4 may have a configuration in which a reinforcing layer is laminated on a resin porous membrane. By providing a reinforcing layer, the water-proof gas-permeable membrane 4 of high strength can be obtained.

A fluororesin porous body or a polyolefin porous body that can be produced by a commonly-known stretching method or extraction method is usable as the material of the resin porous membrane. Examples of the fluororesin include PTFE (polytetrafluoroethylene), polychlorotrifluoroethylene, tetrafluoroethylene-hexafluoropropylene copolymer, and tetrafluoroethylene-ethylene copolymer. Examples of monomers constituting the polyolefin include ethylene, propylene, and 4-methylpentene-1,1-butene. A polyolefin obtained by polymerization of any one of these monomers or a polyolefin obtained by copolymerization of these monomers can be used. Alternatively, a nanofiber film porous body for which polyacrylonitrile, nylon, or polylactic acid is used can be used. In particular, it is preferable to use a PTFE porous body that can ensure gas permeability even with a small area and that functions well to prevent entry of foreign matters into the housing.

Depending on the environment in which the housing 10 is used, the resin porous membrane may be subjected to liquid-repellent treatment. The liquid-repellent treatment can be performed by applying a substance with low surface tension to the resin porous membrane, drying the substance, and then curing the substance. The liquid-repellent agent used for the liquid-repellent treatment may be any agent that allows formation of a coating having a lower surface tension than the resin porous membrane. For example, a liquid-repellent agent containing a polymer having a perfluoroalkyl group is suitable. The application of a liquid-repellent agent can be performed by impregnation, spraying, or the like. In addition, from the standpoint of ensuring sufficient waterproofness, the average pore diameter of the resin porous membrane is desirably 0.01 µm or more and 10 µm or less.

A material having better gas permeability than the resin porous membrane is preferably used as the material of the reinforcing layer. Specifically, a woven fabric, a non-woven fabric, a mesh, a net, a sponge, a foam, or a porous body, which is made of resin or metal, can be used. Examples of the method for joining together the resin porous membrane and the reinforcing layer include adhesive lamination, thermal lamination, heat welding, ultrasonic welding, and bonding using an adhesive.

It is advantageous that the thickness of the water-proof gas-permeable membrane 4 be adjusted, for example, within a range of 1 µm to 5 mm, in view of the strength and the ease of fixing to the support 3. The gas permeability of the resin porous membrane or the water-proof gas-permeable membrane 4 is preferably 0.1 to 300 sec/100 mL in terms of Gurley value.

The support 3 is provided with an inner gas channel 21 configured to allow the water-proof gas-permeable membrane 4 to communicate with the internal space of the housing 10. Specifically, the support 3 has a tubular shape as a whole, and includes: a flange portion 31 having an upper surface to which the water-proof gas-permeable membrane 4 is adhered; and an insertion portion 32 projecting from an under surface of the flange portion 31 and configured to be inserted into the opening 11 of the housing 10. The peripheral portion of the upper surface of the flange portion 31 is tapered so that the diameter increases toward the under surface of the flange portion 31.

A plurality of (in the example of the figure, three) engaging pieces that are radially elastically deformable are formed in the insertion portion 32 by making a plurality of cuts from the lower end of the lower portion of the insertion portion 32. A claw 33 projecting radially outwardly is provided at the lower end of each of these engaging pieces, and the claw 33 is engaged with the opening-surrounding portion of the housing 10.

The cover component 5 forms an outer gas channel 22 opening radially outwardly between the cover component 5 and the water-proof gas-permeable membrane 4 and between the cover component 5 and the support 3. Specifically, the cover component 5 includes: a principal wall 51 facing the waterproof gas-permeable membrane 4; and a plurality of (in the example of the figure, three) hanging walls 52 hanging downwardly from a peripheral portion of the principal wall 51. In the present embodiment, the diameter of the principal wall 51 is set equal to the outer diameter of the flange portion 31 of the support 3.

The hanging walls 52 are arranged at regular angular intervals, and each hanging wall 52 has a shape of an arc extending along the peripheral portion of the principal wall 51. Each hanging wall 52 extends from the under surface of the principal wall 51 beyond the water-proof gas-permeable membrane 4, and the end of the hanging wall 52 is located downwardly of the flat portion of the upper surface of the flange portion 31. In addition, the inner portion of the end of each hanging wall 52 is tapered so that a large space is secured between the inner portion and the tapered surface of the flange portion 31. Furthermore, a coupling piece 53 is provided at the center of each hanging wall 52, and extends from the lower end of the hanging wall 52 to the under surface of the flange portion 31.

In addition, recesses 31a which open radially outwardly and with which the coupling pieces 53 can be engaged are provided in the flange portion 31 at positions corresponding to the coupling pieces 53. A claw projecting radially inwardly is provided at the end of each coupling piece 53, and the claw is engaged with a stepped portion provided in the recess 31a, so that the cover component 5 is coupled to the support 3. When the cover component 5 is coupled to the support 3, the outer surfaces of the coupling pieces 53 and the edge surface of the flange portion 31 form a single cylindrical surface as shown in FIG. 2.

Figure 4:
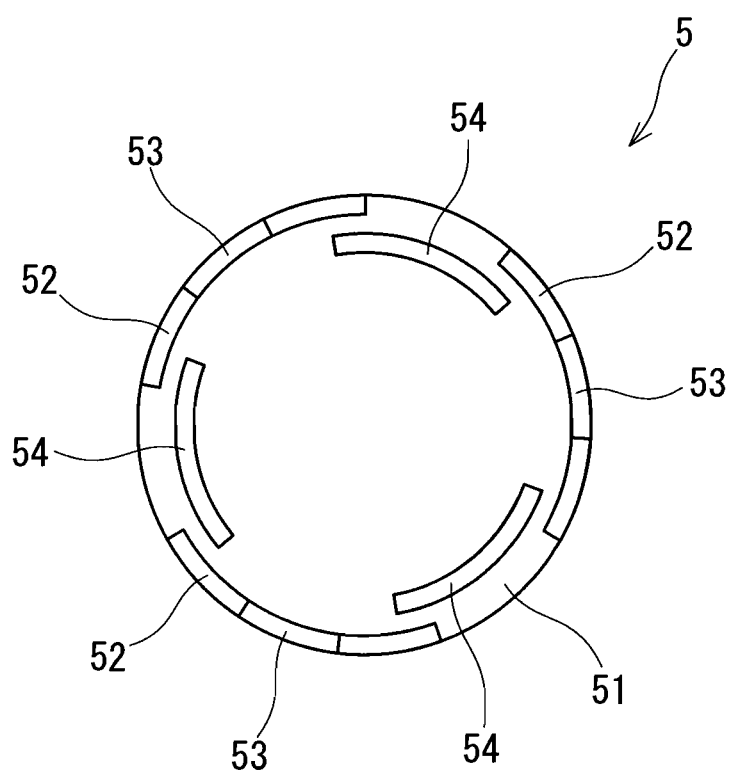
FIG. 4 is a bottom view of a cover component.

Furthermore, as shown in FIG. 4, a plurality of (in the example of the figure, three) arc-shaped inner walls 54 are provided on the under surface of the principal wall 51 in such a manner that a circle defined by the inner walls 54 is smaller than a circle defined by the hanging walls 52. The inner walls 54 are in contact with the flat portion of the upper surface of the flange portion 31, and a space is thus secured between the water-proof gas-permeable membrane 4 and the principal wall 51. In addition, the inner walls 54 are located radially inwardly of the hanging walls 52, and cover the clearances between the hanging walls 52 so as to hide the water-proof gas-permeable membrane 4 from the outside. In other words, the hanging walls 52 and the inner walls 54 form a labyrinth in the vicinity of the opening of the outer gas channel 22 so as to prevent the waterproof gas-permeable membrane 4 from being exposed directly to the outside through the outer gas channel 22.

The sealing member 6 mentioned above is mounted around the root portion of the insertion portion 32 of the support 3. The sealing member 6 seals a gap between the ventilation member 2 and the housing 10 by being pressed against the housing 10 by the flange portion 31. An O-ring, a packing, or the like, can be used as the sealing member 6.

The washer 7 is pressed against the housing 10 by the ventilation member 2 around the sealing member 6. That is, the washer 7 has a thickness greater than the distance by which a peripheral portion of the ventilation member 2 attached to the opening 11 of the housing 10 is spaced from the housing 10.

The inner diameter of the washer 7 is not particularly limited as long as the washer 7 does not interfere with the sealing member 6. In addition, the outer diameter of the washer 7 is set equal to the outer diameter of the flange portion 31 of the support 3 in the present embodiment. However, the outer diameter of the washer 7 may be larger or smaller than the outer diameter of the flange portion 31.

The washer 7 may be formed of a hard material such as a plastic and a metal, but is preferably formed of an elastic material such as a rubber. Furthermore, an elastic material having heat resistance and weather resistance, such as a silicone rubber, is preferable.

In addition, the hardness (Shore A hardness) of the washer 7 is preferably 30 to 70.

In the case of the ventilation unit 1 having been described above, when the ventilation member 2 is attached to the opening 11 of the housing 10, a clearance formed outside the sealing member 6 and between the peripheral portion of the ventilation member 2 and the housing 10 is blocked by the washer 7. Therefore, even in an environment where a high external pressures acts on the ventilation unit, it is possible to prevent foreign matters from entering the housing from between the ventilation member 2 and the housing 10.

In addition, when the ventilation member 2 is pressed into the opening 11, the washer 7 serves as a stopper for restricting the displacement of the ventilation member 2. Therefore, the ventilation member 2 or the housing 10 can be prevented from being broken due to too tight pressing.

Furthermore, in the present embodiment, the water-proof gas-permeable membrane 4 is not exposed directly to the outside by virtue of the hanging walls 52 and the inner walls 54 of the cover component 5. Accordingly, for example, the water-proof gas-permeable membrane 4 is not directly subjected to a jet of high-pressure water, and breakage of the water-proof gas-permeable membrane 4 can be prevented.

The invention claimed is:

1. A ventilation structure comprising a ventilation unit and a housing,
   the ventilation unit including:
   a ventilation member that is attached to an opening of the housing, the ventilation member having a water-proof gas-permeable membrane that covers the opening;
   a sealing member that is pressed against the housing by the ventilation member and seals a gap between the housing and the ventilation member; and
   a washer that is pressed against the housing by the ventilation member, the washer being provided around the sealing member.

2. The ventilation structure according to claim 1, wherein the washer is formed of an elastic material.

3. The ventilation structure according to claim 1, wherein the ventilation member comprises: a support supporting the water-proof gas-permeable membrane and having an inner gas channel configured to allow the water-proof gas-permeable membrane to communicate with an internal space of the housing; and a cover component covering the water-proof gas-permeable membrane and forming an outer gas channel opening radially outwardly between the cover component and the water-proof gas-permeable membrane and between the cover component and the support.

4. The ventilation structure according to claim 3, wherein the cover component comprises: a principal wall facing the water-proof gas-permeable membrane; a plurality of hanging walls hanging downwardly from a peripheral portion of the principal wall and extending beyond the water-proof gas-permeable membrane; and a plurality of inner walls located radially inwardly of the plurality of hanging walls and covering clearances between the plurality of hanging walls so as to hide the water-proof gas-permeable membrane from outside.

5. The ventilation structure according to claim 1, wherein
   in a first state where the sealing member is not deformed, the sealing member has a first loop shape and a first center axis surrounded by the first loop shape,
   in a second state where the washer is not deformed, the washer has a second loop shape and a second center axis surrounded by the second loop shape, and a stiffness of the washer in a direction parallel to the second center axis is higher than a stiffness of the sealing member in a direction parallel to the first center axis.

6. The ventilation structure according to claim 1, wherein the sealing member is in direct contact with the ventilation member and the housing, and
the washer is in direct contact with the ventilation member and the housing.

7. The ventilation structure according to claim 1, wherein the ventilation member comprises a flange portion and an insertion portion,
the flange portion has an upper surface to which the waterproof gas-permeable membrane adhered,
the insertion portion projects from an under surface of the flange portion and is inserted into the opening of the housing,
the sealing member is in direct contact with the flange portion, the insertion portion and the housing, and
the washer is in direct contact with the flange portion and the housing.

8. The ventilation structure according to claim 1, wherein the washer is arranged concentrically with the sealing member.

\* \* \* \* \*